US009561953B1

(12) United States Patent
Elian et al.

(10) Patent No.: US 9,561,953 B1
(45) Date of Patent: Feb. 7, 2017

(54) METHOD OF FORMING A PROTECTIVE COATING FOR A PACKAGED SEMICONDUCTOR DEVICE

(71) Applicant: Infineon Technologies AG, Neubiberg (DE)

(72) Inventors: Klaus Elian, Alteglofsheim (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/833,871

(22) Filed: Aug. 24, 2015

(51) Int. Cl.
| H01L 21/00 | (2006.01) |
| B81C 1/00 | (2006.01) |
| H01L 21/56 | (2006.01) |
| B81B 7/00 | (2006.01) |

(52) U.S. Cl.
CPC ......... *B81C 1/00269* (2013.01); *B81B 7/0032* (2013.01); *H01L 21/563* (2013.01); *B81C 2203/0118* (2013.01)

(58) Field of Classification Search
CPC ... B81C 1/00269; H01L 21/563; B81B 7/0032
See application file for complete search history.

(56) References Cited

U.S. PATENT DOCUMENTS

| 8,803,297 | B2 * | 8/2014 | Nelle | ................. | H01L 23/3192 |
| | | | | | 257/629 |
| 8,864,540 | B2 * | 10/2014 | Wei | ...................... | B32B 15/085 |
| | | | | | 313/506 |
| 9,142,797 | B2 * | 9/2015 | Wei | ....................... | B32B 37/025 |
| 9,218,960 | B2 * | 12/2015 | Nelle | .................. | H01L 23/3192 |
| 2008/0037104 | A1 * | 2/2008 | Hagood | ................ | G02B 26/00 |
| | | | | | 359/292 |
| 2008/0283991 | A1 * | 11/2008 | Reinert | ................... | B81B 7/007 |
| | | | | | 257/685 |
| 2011/0006204 | A1 * | 1/2011 | Bower | .................. | H01J 49/025 |
| | | | | | 250/298 |
| 2011/0291544 | A1 * | 12/2011 | Wei | ...................... | B32B 15/085 |
| | | | | | 313/317 |
| 2013/0136863 | A1 * | 5/2013 | Hiyama | ................ | B05D 1/325 |
| | | | | | 427/259 |

(Continued)

FOREIGN PATENT DOCUMENTS

EP          0544076 A2 *  6/1993  ........... H01L 21/563

*Primary Examiner* — Laura Menz
(74) *Attorney, Agent, or Firm* — Murphy, Bilak & Homiller, PLLC (57) ABSTRACT

A first semiconductor substrate having at least one integrated semiconductor device is provided. A lift-off layer is formed on a main surface of the first semiconductor substrate. The lift-off layer is patterned so as to form openings in the lift-off layer that are arranged on either side of a first portion of the lift-off layer. The first substrate is connected together with a second substrate by an interconnect structure to form an assembly with the main surface of the first semiconductor substrate being exposed. Exposed surfaces of the assembly are coated with a parylene coating, with a first portion of the parylene coating being supported by the first portion of the lift-off layer. The first portion of the parylene coating is selectively removed using a lift-off technique that removes the first portion of the lift-off layer. The lift-off technique is performed after connecting the first substrate and second substrates together.

10 Claims, 10 Drawing Sheets

(56) References Cited

U.S. PATENT DOCUMENTS

| | | | |
|---|---|---|---|
| 2013/0295814 A1* | 11/2013 | Wei | B32B 15/085 |
| | | | 445/23 |
| 2014/0042597 A1* | 2/2014 | Nelle | H01L 23/3192 |
| | | | 257/642 |
| 2014/0131900 A1* | 5/2014 | Haba | H01L 23/3135 |
| | | | 257/786 |
| 2014/0374736 A1* | 12/2014 | Wei | B32B 37/025 |
| | | | 257/40 |
| 2015/0001700 A1 | 1/2015 | Hartung et al. | |
| 2015/0036302 A1* | 2/2015 | Tai | H01L 23/28 |
| | | | 361/752 |
| 2016/0133540 A1* | 5/2016 | Tai | B81C 1/00 |
| | | | 257/790 |

\* cited by examiner

METHOD OF FORMING A PROTECTIVE COATING FOR A PACKAGED SEMICONDUCTOR DEVICE

TECHNICAL FIELD

The instant application relates to semiconductor device packing, and particularly relates to forming a protective coating in a packaging assembly.

BACKGROUND

Semiconductor packaging is commonly used to house and protect integrated circuits, such as controllers, ASIC devices, sensors, etc. Semiconductor packaging should protect the integrated circuits and associated electrical connections (e.g., wire bonds, solder connections, etc.) from potentially damaging environmental conditions, such as extreme temperature variations, moisture, dust particles, etc. Packaging of sensor devices such as MEMs (micro-electromechanical systems) sensor devices presents unique challenges. MEMs devices are commonly used to measure environmental parameters such as temperature, pressure, sound, composition of atmosphere, etc. The sensor elements therefore require at least partial exposure to the exterior environment so that the environmental parameter can be accurately measured. Packaging for a MEMs device therefore must meet the dual goal of protecting the integrated circuits and associated electrical connections while exposing the sensor element(s) of the MEMs device to the exterior environment.

A variety of molded package structures are used to package semiconductor MEMs devices. For example, a pre-molded structure can used to package a MEMs device, and the cavity can be filled with a soft gel, such as a silicone gel. These gels seal and protect the circuitry and electrical connections. According to another technique, the package is molded directly on the MEMs device so as to seal and protect the MEMs device with the encapsulant material (e.g., plastic or ceramic). This may be done by transfer molding, for example. According to another technique, the encapsulant material can be partially formed around the MEMs device, with an opening or chamber exposing a sensing portion of the MEMs device. This opening or chamber can be filled with a soft silicone gel.

The above described techniques suffer from several drawbacks. For example, the gels described above can potentially damage the MEMS device and/or degrade the performance of the MEMS device. In fact, the above mentioned gels cannot be used with certain MEMs devices because the gels partially or completely block the sensor. Furthermore, the molding processes used to form the packaging structures can be costly because these processes require custom tooling for specific MEMS device geometries.

SUMMARY

A method of packaging a semiconductor device is disclosed. According to an embodiment, a first semiconductor substrate having at least one integrated semiconductor device is provided. A lift-off layer is formed on a main surface of the first semiconductor substrate. The lift-off layer is patterned so as to form openings in the lift-off layer that are arranged on either side of a first portion of the lift-off layer. The first substrate is connected together with a second substrate by an interconnect structure with the main surface of the first semiconductor substrate being exposed. Exposed surfaces of the first and second substrates and the interconnect structure are coated with a parylene coating, with a first portion of the parylene coating being supported by the first portion of the lift-off layer. The first portion of the parylene coating is selectively removed using a lift-off technique that removes the first portion of the lift-off layer. The lift-off technique is performed after connecting the first substrate and second substrates together.

According to another embodiment of a method of packaging a semiconductor device, a first semiconductor substrate having a sensor device is provided. A sensing portion of the sensor device is configured to measure an environmental parameter present at a main surface of the first semiconductor substrate. An assembly is formed by mounting the first semiconductor substrate to a second substrate with the sensing portion being spaced apart from the second substrate. Exposed surfaces of the first and second substrates are coated with a parylene coating, the parylene coating protecting the exterior surfaces from moisture and particles. A first portion of the parylene coating that is disposed over the sensing portion is selectively removed such that the sensing portion is exposed from the parylene coating, wherein selectively removing the first portion of the parylene coating is performed after forming the assembly.

A packaged semiconductor device is disclosed. According to an embodiment, the packaged semiconductor device includes a molded cavity package having an interior cavity and electrically conductive leads. The packaged semiconductor device further includes a first semiconductor substrate affixed to the molded cavity package and including at least one integrated semiconductor device. The packaged semiconductor device further includes a second substrate connected to the first semiconductor substrate by an interconnect structure with a main surface of the first semiconductor substrate being spaced apart from the second substrate. The packaged semiconductor device further includes a parylene coating covering surfaces of the first semiconductor substrate, the second substrate and the interconnect structure. The packaged semiconductor device further includes an electrical connection between terminals of at least one of the first and second substrates and at least one of the electrically conductive leads.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein include a method of packaging a semiconductor device, such as a MEMs device, using a protective coating that protects the packaged device from potentially damaging environmental conditions. According to an embodiment, the protective coating is a parylene coating. The parylene coating can be applied in a so-called back end of the line process, which occurs after wafer processing (e.g., doping, metallization, etc.) and can occur after assembling the semiconductor device with at least one other device (e.g., in a flip-chip configuration). The parylene coating can be applied in a non-selective process. For example, the assembly can be placed in a chamber and exposed to an environment that forms the parylene on every exposed surface of the assembly. In this way, the parylene coating will cover all of the areas in the package that are vulnerable to damage from moisture and particles, including all of the electrical interfaces.

A lift-off technique can be used to selectively remove the parylene coating from designated areas. The lift-off technique can be done by pre-processing the assembly prior to applying the parylene coating. More particularly, a lift-off layer is formed and patterned on the semiconductor device prior to applying the parylene coating. The remaining portions of the lift-off layer are disposed over a selected region of the semiconductor device. After the semiconductor device is coated with the parylene, the remaining portions of the lift off layer are removed (e.g., by dissolving). This process removes only the portions of the parylene coating that are disposed on the remaining portions of the lift-off layer without removing the adjacent portions of the parylene coating.

According to an advantageous embodiment, the lift-off layer is patterned with an undercut prior to applying the parylene coating. This undercut creates a gap between the paralyene coating that is formed on the remaining portions of the lift-off layer and the adjacent portions of the parylene coating that are formed directly on the substrate. The gap ensures that only the selected portions of the parylene coating (i.e., the portions disposed on the remaining portions of the lift-off layer) break away from the substrate without simultaneously removing the parylene coating from regions. Thus, the process offers precise selective removal of the parylene coating in a desired area, such as the sensing portion of a MEMs device. In this way, the sensing portion can be completely exposed to the exterior environment while remaining portions of the packaged device remain protected by the parylene coating.

Figure 1:
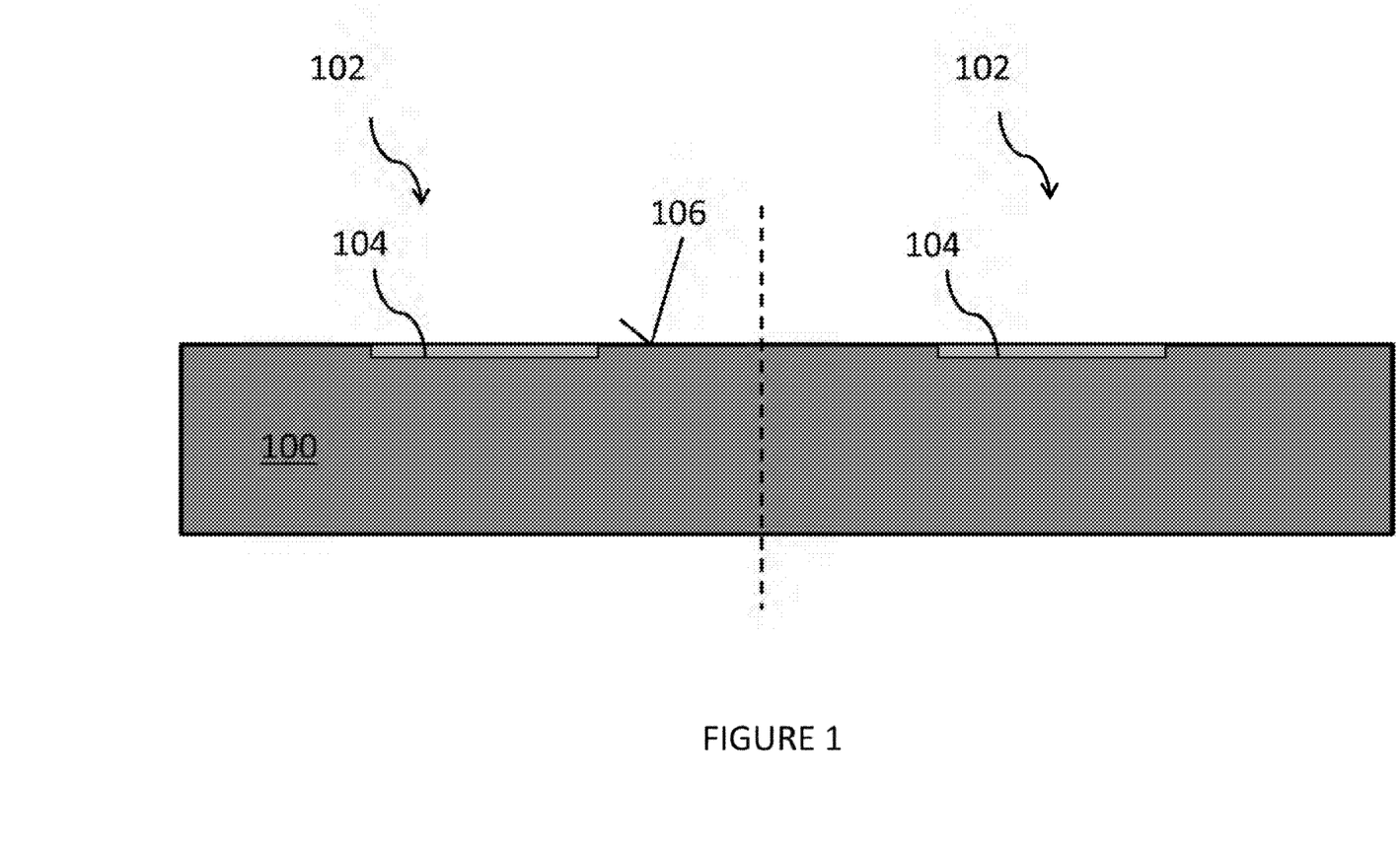
FIG. 1 illustrates a semiconductor wafer with a plurality of semiconductor devices, according to an embodiment.

Referring to FIG. 1, a semiconductor wafer 100 is depicted. The semiconductor wafer 100 includes a plurality of first substrates 102, i.e., semiconductor dies, with each of the first substrates 102 having at least one integrated semiconductor device. The wafer of FIG. 1 includes two of the first substrates 102 for illustration purposes only, and a single semiconductor wafer 100 may include a large number of discrete semiconductor devices, and may include hundreds or thousands of the first substrates 102. The semiconductor devices in each of the first substrates 102 may be any of a variety of integrated circuit devices, such as a switching device, logic device, memory, controller, sensor, etc. The semiconductor material of the semiconductor wafer 100 may include any one or combination of a variety of semiconductor materials that are used to form integrated semiconductor devices such as silicon (Si), silicon germanium (SiGe), silicon carbide (SiC), gallium nitride (GaN), gallium aluminium nitride (GaAlN) or the like, for example.

According to an embodiment, each of the first substrates 102 includes a MEMs sensor device. The MEMs sensor devices include a sensing portion 104 that is configured to measure an environmental parameter present at a main surface 106 of the first substrate 102. For example, the sensing portion 104 may be a pressure sensor configured to detect ambient air pressure at the main surface 106. The sensing portion 104 may be disposed directly on the main surface 106 of the first substrate 102, or may be disposed within the semiconductor substrate first substrate 102.

Figure 2:
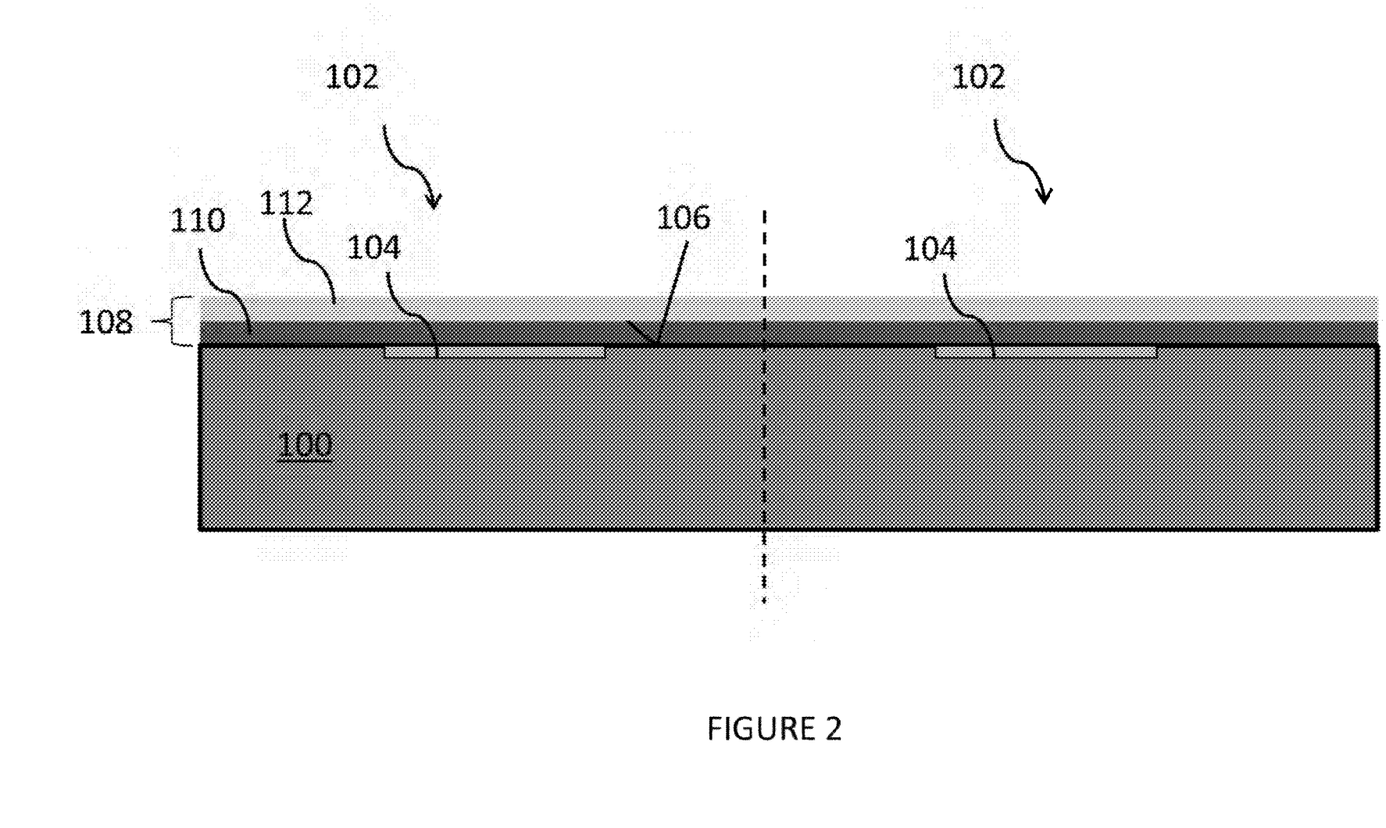
FIG. 2 illustrates forming a removable lift-off layer formed on the wafer that includes first and second layers, according to an embodiment.

Referring to FIG. 2, a lift-off layer 108 is formed on the semiconductor wafer 100. The lift-off layer 108 is formed on a main surface 106 of semiconductor wafer 100, which extends between lateral edge sides of the semiconductor wafer 100.

According to an embodiment, the lift-off layer 108 completely covers the main surface 106 of the semiconductor wafer 100 in this process step. The lift-off layer 108 may be formed from any of a variety of materials that are suitable for lift-off processing techniques. According to an embodiment, the lift-off layer 108 includes a layer or layers of lift-off resist (LOR) and/or Polymethylglutarimide (PMGI).

The lift-off layer 108 can include two or more layers formed on top of one another. According to the embodiment depicted in FIG. 2, a first layer 110 is formed on the main surface 106 and a second layer 112 is formed on the first layer 110. The first layer 110 may be an LOR or PMGI layer, for example, and the second layer 112 may be a photoresistant coating that is applied to the first layer 110, such as Dow SPR220 positive photoresist or Microchemicals AZ® TX 1311.

Figure 3:
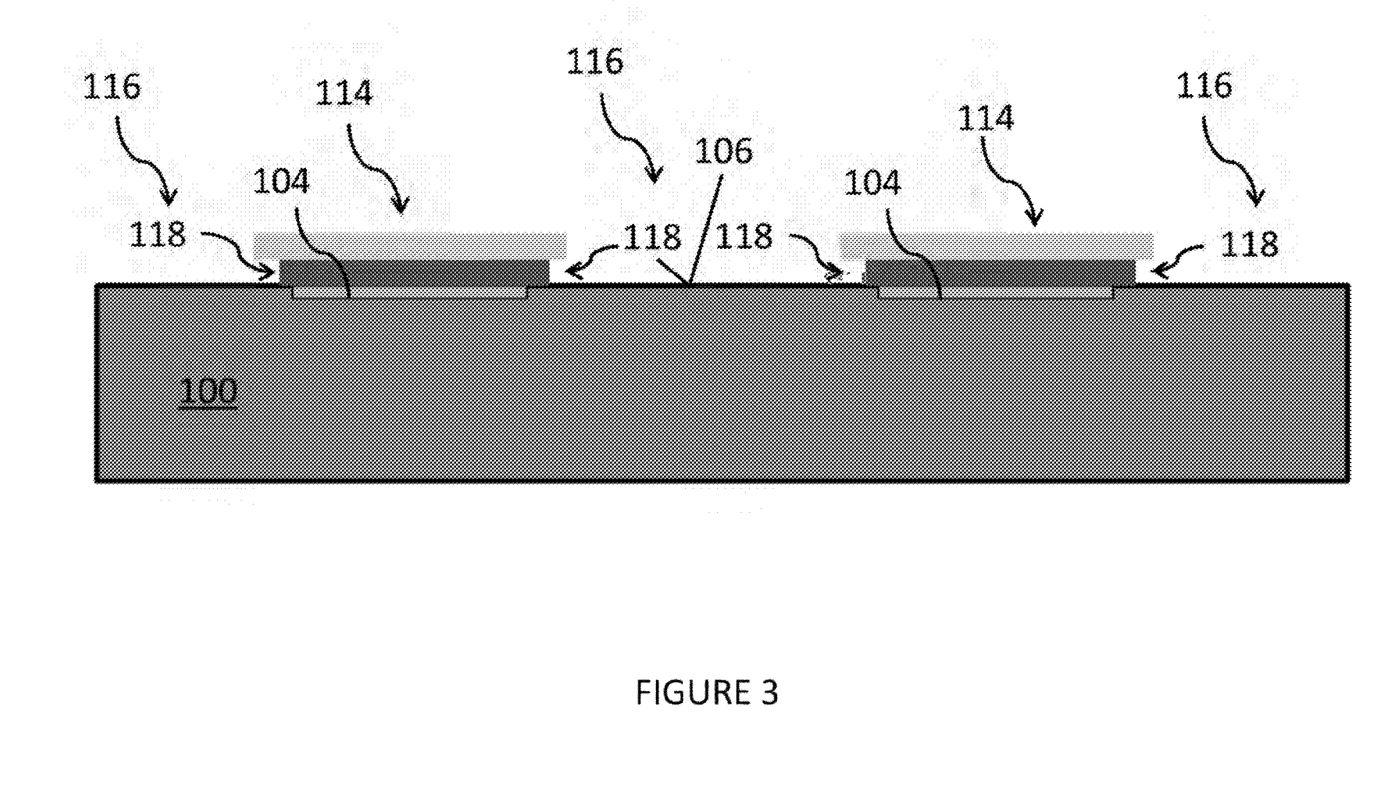
FIG. 3 illustrates patterning the lift-off layer such that remaining portions of the lift-off layer cover selected portions of the wafer, according to an embodiment.

Referring to FIG. 3, the lift-off layer 108 has been patterned. The patterning technique includes removing portions of the lift-off layer 108 from the first substrate 102 so as to expose the main surface 106. This can be done using photolithography techniques, for example. According to an exemplary photolithography technique, the lift-off layer 108 is exposed to a radiation source, e.g., a visible light or a laser source, with only certain regions being exposed to the radiation. The exposed region is subsequently developed to remove the exposed regions from the first substrate 102.

After the lift-off layer 108 is patterned, a first portion 114 of the lift-off layer 108, remains on the first substrate 102. The first portion 114 of the lift-off layer 108 includes remaining portions of the first and second layers 110, 112. Openings 116 in the lift-off layer 108 (i.e., regions where the main surface 106 is exposed from the lift-off layer 108) are arranged on either side of the first portion 114 of the lift-off layer 108. The openings 116 can extend to the edge of the semiconductor wafer 100, and can occupy anywhere from a substantial majority of the overall area of the semiconductor wafer 100 to a substantial minority of the overall area of the semiconductor wafer 100. The location of the first portion 114 of the lift-off layer 108 corresponds to a preselected location. For example, if the first substrates 102 are configured as MEMs devices, the first portion 114 of the lift-off layer 108 can be formed directly over the sensing portion 104 of the MEMs device. As a result, the sensing portion 104 of each MEMs device remains covered by the lift-off layer 108 after the patterning process.

According to an embodiment, an undercut 118 is formed in the first portion 114 of the lift-off layer 108. In an undercut 118 configuration, the first portion 114 of the lift-off layer 108 is narrower at the main surface 106 and wider at a distance away from the main surface 106. If, for example, the lift-off layer 108 includes the first and second layers 110, 112 described herein, the undercut 118 may be formed by patterning the second layer 112 to extend past the first layer 110 and over the openings 116. That is, the remaining portions of the second layer 112 overhang past the remaining portions of the first layer 110.

Figure 4:
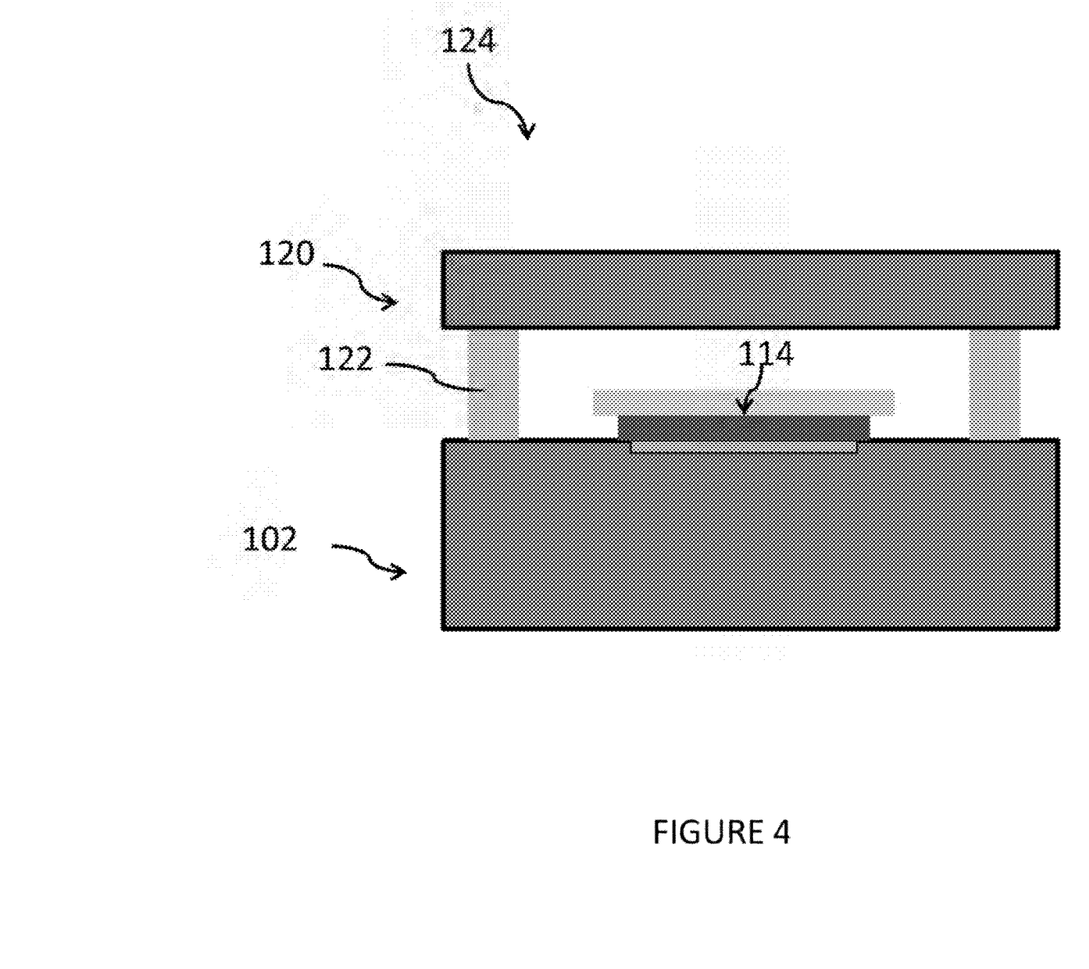
FIG. 4 illustrates an assembly that is formed by dicing the wafer into a plurality of semiconductor devices and electrically connecting one of the diced semiconductor devices to another substrate, according to an embodiment.

Referring to FIG. 4, the first substrate 102 has been separated from the semiconductor wafer 100 and assembled with another device. The semiconductor wafer 100 may be separated by sawing, for example. After sawing, one of the first substrates 102 is connected to a second substrate 120. According to an embodiment, the main surface 106 of the first substrate 102 is exposed after assembly. That is, the second substrate 120 is not flush against the main surface 106 of the first substrate 102.

The first and second substrates 102, 120 can be connected together by any of a variety of techniques, such as solder, brazing, adhesive tape, paste, etc. The connection elements can be formed in the openings 116 of the lift-off layer 108 (i.e., portions of the main surface 106 that are exposed from the lift-off layer 108), after the lift-off layer 108 has been patterned, such that the connection elements directly contact the main surface 106. Further, the connection elements can be formed before or after the first substrate 102 has been separated from the semiconductor wafer 100. Additionally or in the alternative, the connection elements can be formed on the second substrate 120 prior to assembly.

According to an embodiment, the first substrate 102 is connected together with the second substrate 120 using an electrically conductive interconnect structure 122. The interconnect structure 122 can be a copper solder bump or stud, for example, which can be annealed (i.e., heated to a sufficiently high temperature) so as to adhere the first and second substrates 102, 120 together with the interconnect structure 122.

In the assembly 124 of the first and second substrates 102, 120, the second substrate 120 may be, but is not necessarily, a functional device. For example, the second substrate 120 may be identical to the first substrate 102, and may be provided from the same semiconductor wafer 100. Other exemplary functional implementations of the second substrate 120 include switching devices, logic devices, memory devices, controllers, senses, etc. Alternatively, the second substrate 120 can be devoid of any functional circuitry. For example, the second substrate 120 can be a heat sink, a planar base plate of a device package or a PCB (printed circuit board). The orientation of the first substrate 102, relative to the second substrate 120, may vary, provided that the portion of the first substrate 102 that includes the lift-off layer 108 remains accessible after the connecting of the first and second substrates 102, 120 together. According to another embodiment, the second substrate 120 is flush against a rear surface of the first substrate 102 that is opposite from the main surface 106.

According an embodiment, the assembly 124 of the first and second substrates 102, 120 is a flip-chip configuration. In this configuration, the main surface 106 of the first substrate 102 faces the second substrate 120, and the interconnect structure 122 provides an electrical connection between conductive terminal disposed on the surfaces of the first and second substrates 102, 120. If, for example, the first substrate 102 includes a MEMs sensor device, the size of the solder bump or stud can be sufficiently large to provide a separation distance between the sensor device and the second substrate 120. This ensures that the sensor device is sufficiently separated from the second substrate 120 and can be exposed to whatever environmental parameter the sensor device is designed to measure (e.g., pressure, temperature, etc.).

Figure 5:
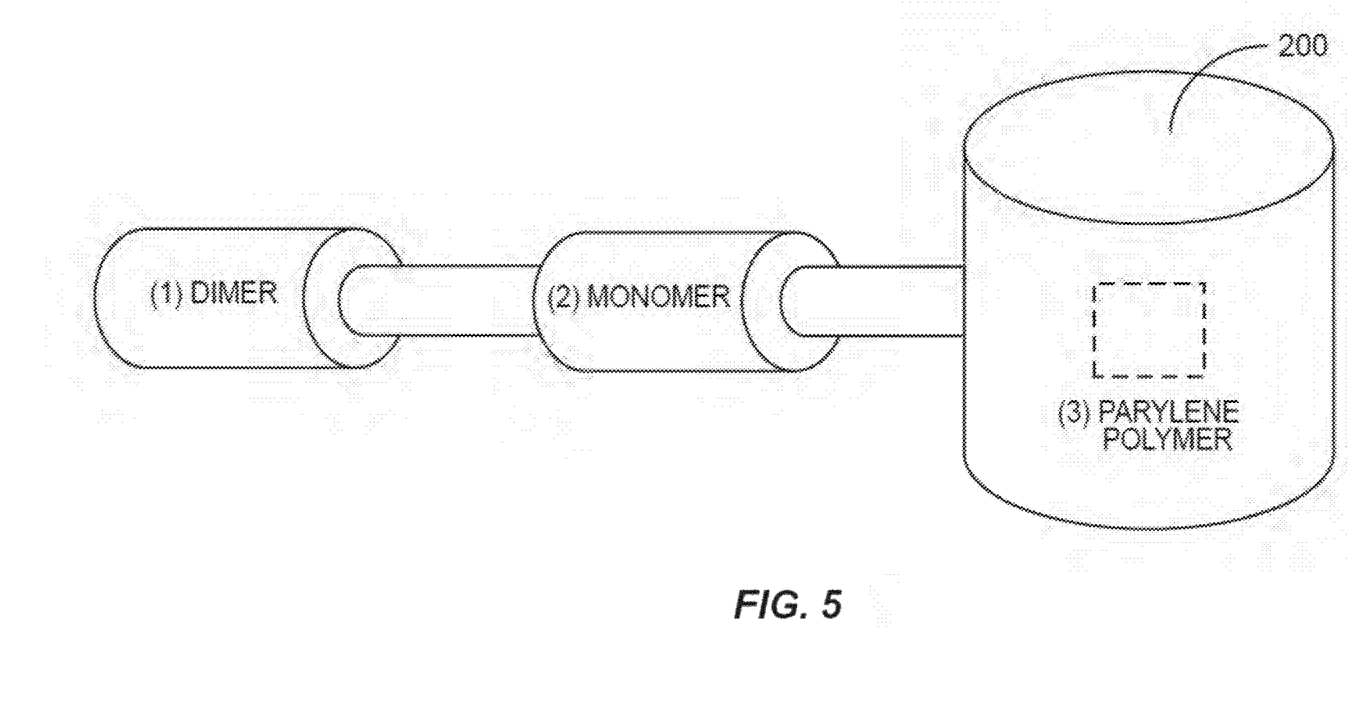
FIG. 5 illustrates a parylene coating process that can be applied to the assembly, according to an embodiment.

FIG. 5 illustrates a technique for coating exposed surfaces of the assembly 124 with parylene, according to an embodiment. According to this technique, the assembly 124 is placed in a deposition chamber 200. The assembly 124 is represented by a dashed box in FIG. 5. The assembly 124 can be coated with parylene one or more times. A primer can be applied to the assembly 124, by an oxygen plasma, before the module is first coated with parylene.

In each case, the parylene deposition process includes vaporizing a solid dimer at a first elevated temperature, e.g., at about 150° C. and 1.0 torr (Step 1). The dimer is then decomposed by pyrolysis at a second elevated temperature greater than the first elevated temperature in the absence of oxygen to yield monomeric para-xylylene, e.g., at about 690° C. and 0.5 torr (Step 2). The monomeric para-xylylene is then injected into the deposition chamber 200 that includes the module at a temperature lower than the first and second elevated temperatures so that the monomeric para-xylylene polymerizes on the module, e.g., at about 25° C. and 0.1 torr (Step 3). This is just one example of a parylene coating process, and any other parylene deposition processes can be used to coat the assembly 124 with parylene.

Figure 6:
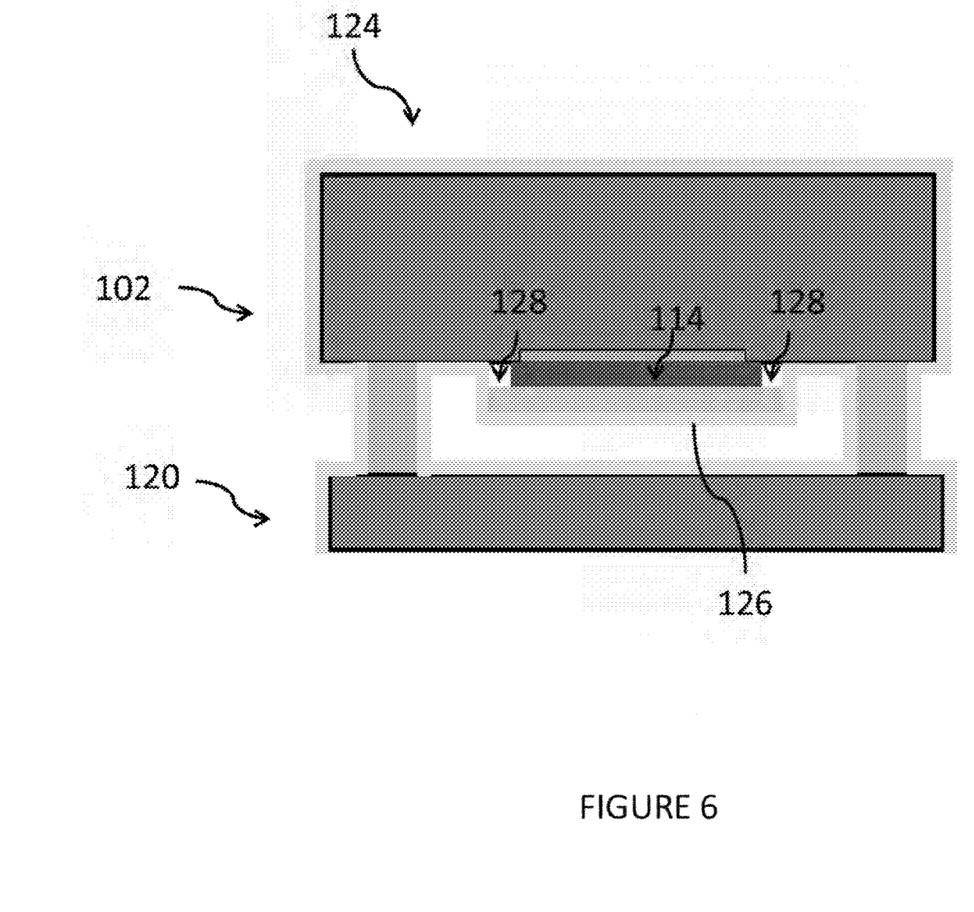
FIG. 6 illustrates the assembly with exposed surfaces being coated by parylene, according to an embodiment.

Referring to FIG. 6, the assembly 124 is depicted after the exposed surfaces of the assembly 124 have been coated with parylene, e.g., as described with reference to FIG. 5. The parylene coating process non-selectively coats all exposed surfaces of the first and second substrates 102, 120, as well as any exposed surfaces of an interconnect structure 122. Because the first and second substrates 102, 120 are spaced apart from one another, the parylene coating forms on the surfaces of the first and second substrates 102, 120 that face one other (including the main surface 106 of the first substrate 102 and the lift-off structure). In this example, the assembly 124 was placed in the deposition chamber 200 with the lower side of the second substrate 120 being flush against another surface. Thus, the lower side of the second substrate 120 was not exposed and does not have a parylene coating.

A first portion 126 of the parylene coating is disposed on and in contact with the first portion 114 of the lift-off layer 108. Furthermore, gaps 128 form between the first portion 114 of the parylene coating and the adjacent portions of the parylene coating, which form in the openings 116. These gaps 128 are caused by the undercut 118 in the lift-off layer 108. During the parylene deposition process, the parylene that forms on the main surface 106 and underneath the second layer 112 (i.e., in the region of the undercut 118) blocks the parylene coating from entering any further underneath the second layer 112. That is, the parylene cannot reach the inner surfaces of the first layer 110, due to the geometry of the undercut 118.

Figure 7:
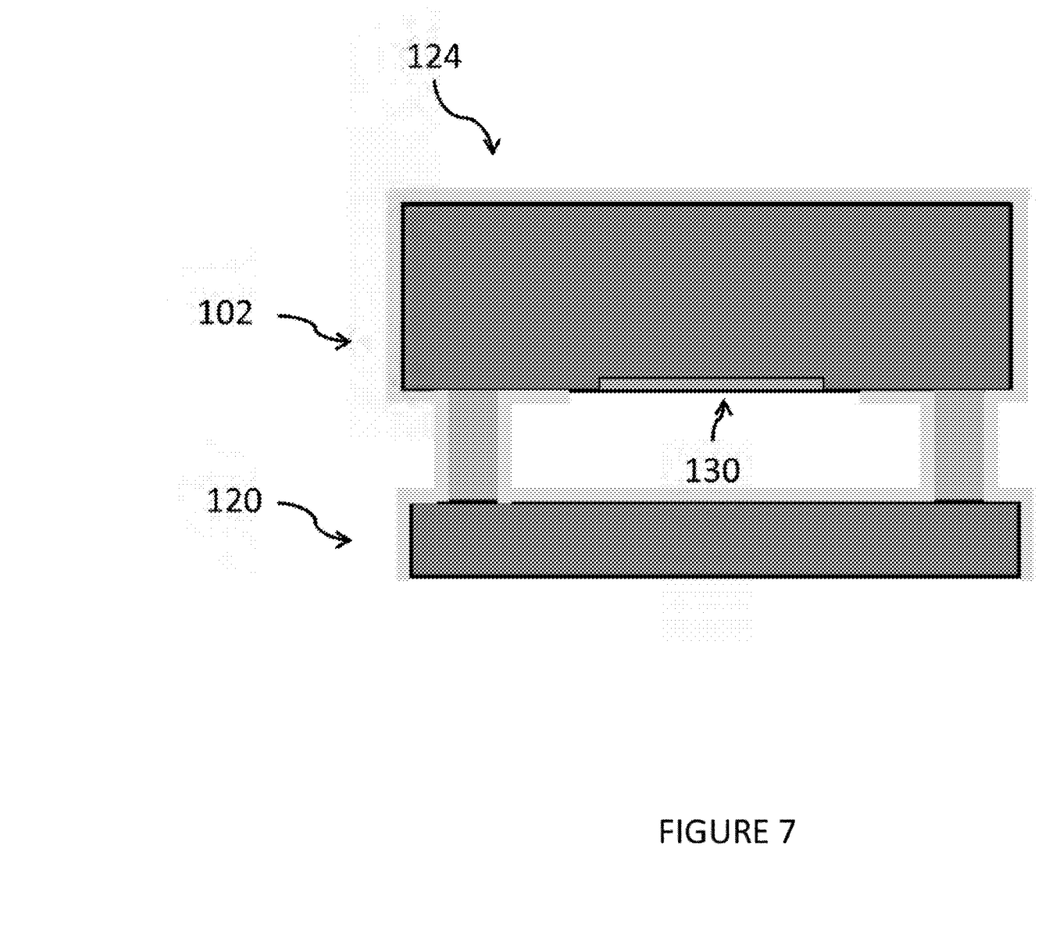
FIG. 7 illustrates the assembly after performing a lift-off technique that removes first portions of the parylene coating without removing adjacent portions of the parylene coating, according to an embodiment.

Referring to FIG. 7, a lift-off technique is used to selectively remove both the first portion 114 of the lift-off layer 108 and the first portion 126 of the parylene coating, which is disposed on the first portion 114 of the lift-off layer 108. As a result, a first section 130 of the main surface 106 that was covered by the first portion 114 of the lift-off layer 108 is exposed from the parylene coating. However, every other region of the assembly 124 outside of the first section 130 of the main surface 106 (with the exception of the lower side of the second substrate 120) remains covered by the parylene coating.

According to an embodiment, the first portion 114 of the lift-off layer 108 is removed by a chemical dissolving process. For example, the assembly 124 may be placed in an aqueous solution such as a water based 2.38% tetramethyl-ammoniumhydroxide solution (typical TMAH developer) that selectively dissolves the first portion 114 of the lift-off layer 108 and detaches the first portion 114 of the lift-off layer 108 from the first substrate 102. The aqueous solution is able to flow into the gaps 128 of the parylene coating and thereby react with the material from the first portion 114 of the lift-off layer 108 (e.g., the LOR or PMGI material) and ultimately remove both the first portion 114 of the lift-off layer 108 and the first portion 126 of the parylene coating.

Figure 8:
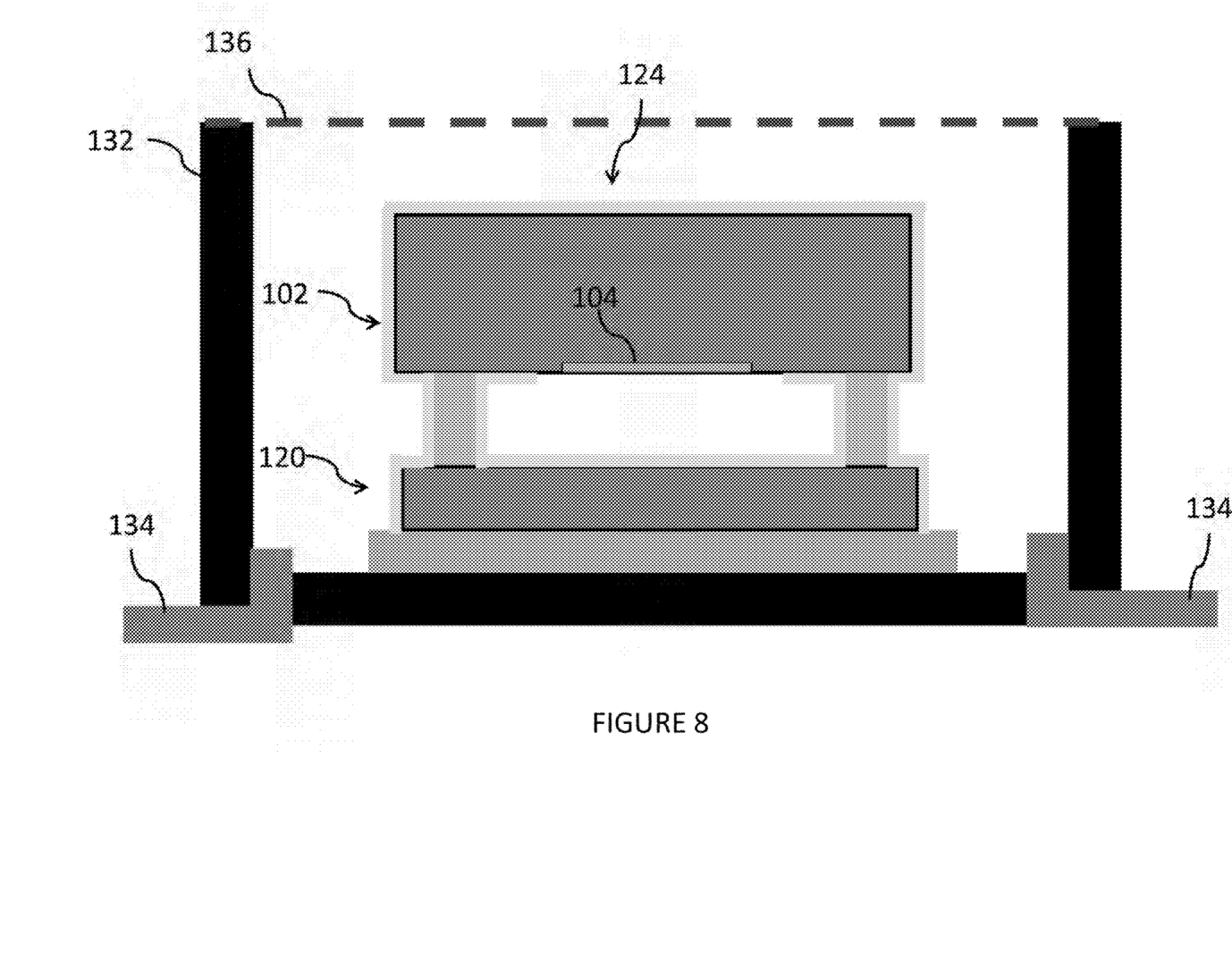
FIG. 8 illustrates the assembly mounted to a molded cavity package, according to an embodiment.

Referring to FIG. 8, the assembly 124 has been placed in a package with the parylene coating protecting the first and second substrates 102, 120 and the electrical connections between the two. According to an embodiment, a pre-molded cavity package is provided. The pre-molded cavity package includes an electrically insulating encapsulant material, such as a ceramic or plastic. The encapsulant forms the exterior sidewalls 132 of the pre-molded cavity package that enclose an interior cavity (i.e., a three dimensional interior volume). The pre-molded cavity package includes a plurality of electrically conductive leads 134 that provide electrical access between the inside and the outside of the interior cavity. The features of the pre-molded cavity package such as size, shape, lead configuration, lead count, etc., may vary, depending on user requirements. According to an embodiment, the pre-molded cavity package is a Dual Small Flat Outline (DSOF) package.

The assembly 124 is adhered to the molded cavity package. This may be done by any of a variety of adhesion techniques, such as glue, solder, tape, etc. In the depicted embodiment, the adhesive is provided between the second substrate 120 and the molded cavity package. However, this arrangement is just one example, and the first substrate 102 may also be adhered to the molded cavity package. A metal base plate and/or heat sink may also be provided between the assembly 124 and the package. After adhering the assembly 124 with the molded cavity package, a cover 136 is placed over an open side of the interior cavity. According to an embodiment, the cover 136 is a gas-permeable membrane, such as GORE-TEX® or stretched polyethelene. In this embodiment, the first substrate 102 may include a MEMs sensor device, such as a pressure sensor that detects ambient air pressure at the main surface 106. The gas-permeable membrane protects the assembly 124 from damaging particles and moisture, but allows the assembly 124 to be exposed to the environmental conditions to which the MEMs sensor device is intended to measure.

Figure 9:
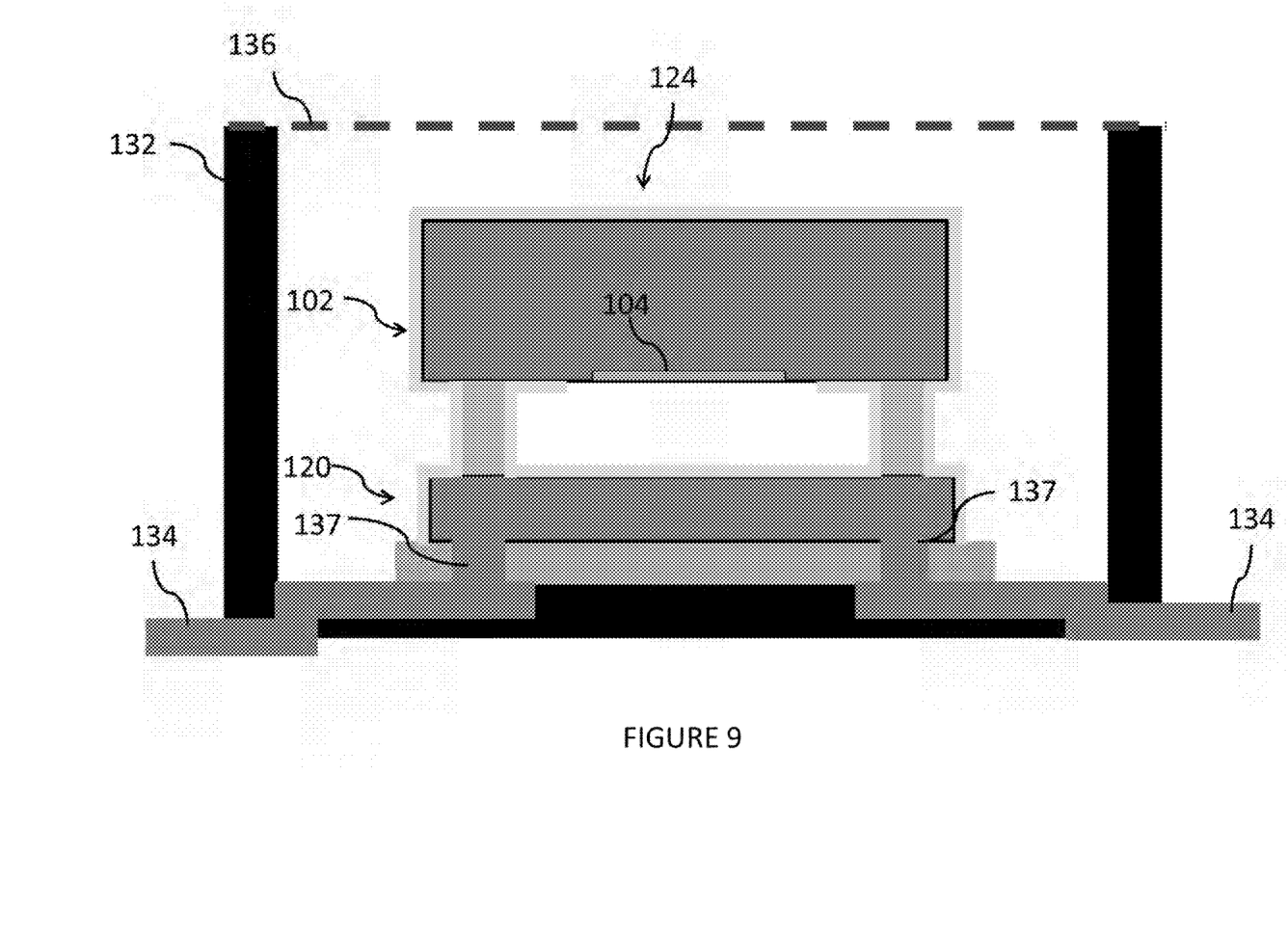
FIG. 9 illustrates the assembly electrically connected to the molded cavity package, according to an embodiment.
Figure 10:
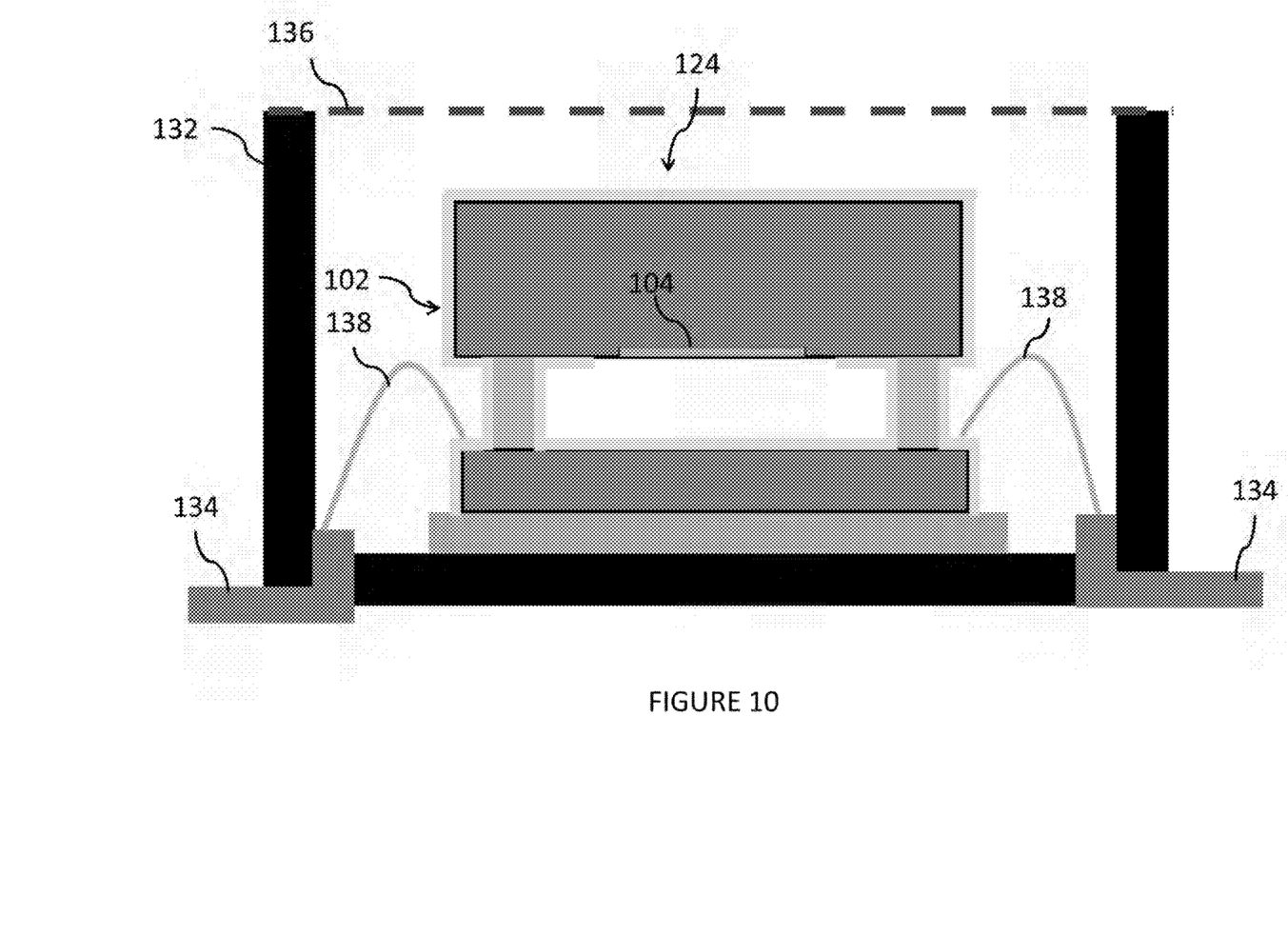
FIG. 10 illustrates the assembly electrically connected to the molded cavity package, according to another embodiment.

Referring to FIGS. 9 and 10, the electrically conductive leads 134 of the molded cavity package are connected to either one or both of the first and second substrates 102, 120. The first and second substrates 102, 120 include electrically conductive terminals that allow for the electrical connection to be effectuated. Depending on the configuration of the assembly 124, either one or both the electrically conductive terminals of the first and second substrates 102, 120 may be connected to the electrically conductive leads 134.

The electrical connection may be effectuated using any of a variety of techniques, such as wire bonds, ribbons, clips, solder, PCB, etc. In the embodiment of FIG. 9, the electrical connection is completed by a though-silicon-via 137 (TSV) that extends through the second substrate 120. In the embodiment of FIG. 10, bonding wires 138 are formed between the leads 134 and terminals (e.g., bond pads) disposed on the second substrate 120. A protective material, such as glop-top, may be deposited on the terminals and bonding wires to further protect the electrical connections from harsh environmental.

Advantageously, the techniques described herein allow for the packaging of a MEMS device using a pre-molded cavity package without the need of silicone gels or potting compounds to protect the semiconductor devices packaged therein. This advantageously reduces packaging cost, as pre-molded cavity packages are significantly less expensive than form-fitting packaging structures. Furthermore, because the parylene coating is applied in a back end of the line process, after assembly of the first substrate 102, all of the components and associated electrical connections can be adequately protected without the need for soft gels. Further, the MEMs device can be exposed to the measuring environment by removing selected portions of the parylene coating with a high degree of accuracy at minimal expense. The lift-off technique is highly selective insofar as only the portions of the parylene coating that the manufacturer chooses to remove (e.g., the portions that cover the sensing portion 104 of the MEMs device) can be removed without removing any other portions of the parylene coating.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of packaging a semiconductor device, the method comprising:
providing a first semiconductor substrate comprising at least one integrated semiconductor device;
forming a lift-off layer on a main surface of the first semiconductor substrate;

patterning the lift-off layer so as to form openings in the lift-off layer that are arranged on either side of a first portion of the lift-off layer;

connecting the first substrate together with a second substrate by an interconnect structure with the main surface of the first semiconductor substrate being exposed;

coating exposed surfaces of the first and second substrates and the interconnect structure with a parylene coating, a first portion of the parylene coating being supported by the first portion of the lift-off layer; and selectively removing the first portion of the parylene coating using a lift-off technique that removes the first portion of the lift-off layer, wherein the lift-off technique is performed after connecting the first substrate and second substrates together.

2. The method of claim 1, wherein forming the lift-off layer comprises forming a first layer on the main surface and forming a second layer on the first layer, wherein patterning the multilayer lift-off structure comprises forming an undercut in the first and second layers such that portions of the second layer extend past the first layer and over the openings.

3. The method of claim 2, wherein the undercut causes gaps to form between the first portion of the parylene coating and adjacent portions of the parylene coating during the coating of the exposed surfaces, and wherein the gap prevents the adjacent portions of the parylene coating from being altered when the first portion of the parylene coating is removed.

4. The method of claim 3, wherein the first portion of the parylene coating is removed by flowing an aqueous solution into the gaps, wherein the aqueous solution dissolves the first portion of the lift-off layer.

5. The method of claim 1, wherein coating the exposed surfaces of the first and second substrates comprises, after connecting the first substrate together with the second substrate, placing the first and second substrates in a coating chamber so as to non-selectively coat all exposed surfaces of the first and second substrates.

6. The method of claim 5, wherein connecting the first substrate together with the second substrate comprises:

forming the interconnect structure in the openings of the lift-off layer such that the interconnect structure directly contacts the main surface; and annealing the interconnect structure so as to adhere the first and second substrates together with the interconnect structure, wherein the interconnect structure is formed after patterning the lift-off layer and before coating the exposed surfaces.

7. The method of claim 6, wherein the second substrate comprises at least one integrated semiconductor device, wherein the first and second substrates are connected to one another in a flip chip assembly, wherein the interconnect at structure provides an electrical connection between the first and second substrates.

8. The method of claim 7, further comprising:

providing a pre-molded cavity package comprising an interior cavity and electrically conductive leads;

mounting the flip chip assembly within the interior cavity such that the second substrate is adhered to the pre-molded cavity package; and electrically connecting terminals of at least one of the first and second substrates with at least one of the electrically conductive leads.

9. The method of claim 8, wherein the first substrate comprises a MEMs sensor device, and wherein a sensing portion of the MEMs sensor device is uncovered from the parylene coating after selectively removing the first portion of the parylene coating.

10. The method of claim 9, wherein the MEMs sensor device comprises a pressure sensor configured to detect ambient air pressure at the main surface, and wherein the method further comprises forming a gas-permeable membrane extending over an open side of the interior cavity after mounting the flip chip assembly within the interior cavity.

* * * * *